(12) United States Patent
Rostalski et al.

(10) Patent No.: US 7,411,201 B2
(45) Date of Patent: Aug. 12, 2008

(54) PROJECTION OBJECTIVE FOR A MICROLITHOGRAPHIC PROJECTION EXPOSURE APPARATUS

(75) Inventors: Hans-Juergen Rostalski, Oberkochen (DE); Aurelian Dodoc, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/460,706

(22) Filed: Jul. 28, 2006

(65) Prior Publication Data

US 2007/0019170 A1    Jan. 25, 2007

Related U.S. Application Data

(63) Continuation of application No. PCT/EP2005/00641, filed on Jan. 24, 2005.

(60) Provisional application No. 60/542,924, filed on Feb. 9, 2004.

(51) Int. Cl.
*G21G 5/00* (2006.01)

(52) U.S. Cl. ................. 250/492.2; 250/492.1; 359/649; 359/396; 359/656; 359/675; 359/798

(58) Field of Classification Search ............. 250/492.2, 250/492.1; 355/30; 359/649, 396, 656, 675, 359/798, 804

See application file for complete search history.

(56) References Cited

U.S. PATENT DOCUMENTS 5,825,043 A * 10/1998 Suwa .......................... 250/548
6,304,317 B1 * 10/2001 Taniguchi et al. ............. 355/55
6,765,656 B2 * 7/2004 Johnson ....................... 356/73
2002/0171815 A1 * 11/2002 Matsuyama et al. ........... 355/55
2004/0109237 A1 * 6/2004 Epple et al. ................. 359/649
2005/0132914 A1 * 6/2005 Mulkens et al. ........... 101/463.1
2005/0225737 A1 * 10/2005 Weissenrieder et al. ....... 355/53
2006/0227306 A1 * 10/2006 Hirukawa et al. ............. 355/52

FOREIGN PATENT DOCUMENTS

| DE | 224 448 | 7/1985 |
| EP | 0 638 847 | 2/1995 |
| EP | 1 431 826 | 6/2004 |

* cited by examiner

*Primary Examiner*—Jack I. Berman
*Assistant Examiner*—Michael J Logie
(74) *Attorney, Agent, or Firm*—Fish & Richardson P.C.

(57) ABSTRACT

A projection objective of a microlithographic projection exposure apparatus has a last optical element on the image side which is plane on the image side and which, together with an image plane of the projection objective, delimits an immersion space in the direction of an optical axis of the projection objective. This immersion space can be filled with an immersion liquid. At least one liquid or solid volume having plane-parallel interfaces can be introduced into the beam path of the projection objective, the optical thickness of the at least one volume being at least substantially equal to the optical thickness of the immersion space. By introducing and removing the volume, it is possible to convert the projection objective from dry operation to immersed operation in a straightforward way, without extensive adjustments to the projection objective or alignment work.

33 Claims, 6 Drawing Sheets

PROJECTION OBJECTIVE FOR A MICROLITHOGRAPHIC PROJECTION EXPOSURE APPARATUS

CROSS-REFERENCE TO RELATED APPLICATIONS

This is a continuation of international application PCT/EP2005/000641 filed Jan. 24, 2005 and claiming benefit of U.S. provisional application 60/542,924, which was filed Feb. 9, 2004. The full disclosure of these earlier applications is incorporated herein by reference.

BACKGROUND OF THE INVENTION

1. Field of the Invention

The invention relates to a projection objective for microlithographic projection exposure apparatuses, such as those used for the production of large-scale integrated electrical circuits and other microstructured components.

2. Description of Related Art

Integrated electrical circuits and other microstructured components are conventionally produced by applying a plurality of structured layers to a suitable substrate which, for example, may be a silicon wafer. In order to structure the layers, they are first covered with a photoresist which is sensitive to light of a particular wavelength range, for example light in the deep ultraviolet (DUV) spectral range.

The wafer coated in this way is subsequently exposed in a projection exposure apparatus. A pattern of diffracting structures, which is arranged on a mask, is projected onto the photoresist with the aid of a projection objective. Since the imaging scale is generally less than 1, such projection objectives are also often referred to as reduction objectives.

After the photoresist has been developed, the wafer is subjected to an etching process so that the layer becomes structured according to the pattern on the mask. The remaining photoresist is then removed from the other parts of the layer. This process is repeated until all the layers have been applied to the wafer.

One of the essential aims in the development of projection exposure apparatuses used for production is to be able to lithographically define structures with smaller and smaller dimensions on the wafer. Small structures lead to high integration densities, and this generally has a favourable effect on the performance of the microstructured components produced with the aid of such systems.

The size of the structures which can be defined depends primarily on the resolution of the projection objective being used. Since the resolution of the projection objectives is proportional to the wavelength of the projection light, one way of increasing the resolution is to use projection light with shorter and shorter wavelengths. The shortest wavelengths used at present are in the deep ultraviolet (DUV) spectral range, namely 193 nm and 157 nm.

Another way of increasing the resolution is based on the idea of introducing an immersion liquid with a high refractive index into an intermediate space which remains between a last lens on the image side of the projection objective and the photoresist or other photosensitive layer to be exposed. Projection objectives which are designed for immersed operation, and which are therefore also referred to as immersion objectives, can achieve numerical apertures of more than 1, for example 1.3 or 1.4. The immersion moreover not only allows high numerical apertures and therefore an improved resolution, but also has a favourable effect on the depth of focus. The greater the depth of focus is, the less stringent are the requirements for exact positioning of the wafer in the image plane of the projection objective.

Carrying out immersed operation, however, requires considerable extra outlay on construction and process technology. For example, it is necessary to ensure that the optical properties of the immersion liquid are spatially homogeneous and constant as a function of time, at least in the volume exposed to the projection light, even if the substrate with the photosensitive layer applied to it moves relative to the projection objective. The technological difficulties associated with this have not yet been resolved satisfactorily.

It has therefore been considered expedient that projection objectives designed for dry operation, which will be referred to below as "dry objectives" for short, should be operated in immersion only during particularly critical process steps. Of course, with a objective designed for dry operation it is not possible to increase the numerical aperture since this requires a different configuration of the projection objective. Nevertheless, a higher depth of focus is achieved even in the immersed operation of dry objectives, and this can be advantageous in particularly critical process steps. The dry objective may be used without an immersion liquid in the less critical process steps, so that the exposure of the wafer is simplified considerably and, as a general rule, can be carried out more rapidly.

However, the introduction of an immersion liquid into the immersion space will affect the imaging by the projection objective in such a way that major adjustments to the dry objective have to be carried out before the immersed operation commences. Such adjustments are described in US 2004/109237 A1. The original state has to be restored for a subsequent change to dry operation, which again entails significant costs. Of course, it is also possible to configure the dry objective a priori so that it can be operated in immersion. The numerical aperture must then remain less than 1, since otherwise total reflection would occur at particular optical surfaces during the dry operation. But in this case, too, adjustments are necessary for a change to dry operation since the removal of immersion liquid naturally also affects the imaging.

SUMMARY OF THE INVENTION

It is therefore an object of the invention to provide a projection objective in which a change from dry operation to immersed operation, and vice versa, can be carried out in a straightforward way.

This object is achieved by a projection objective having a last optical element on the image side which is plane on the image side and which, together with an image plane of the projection objective, delimits an immersion space in the direction of an optical axis of the projection objective, which can be filled with an immersion liquid. At least one liquid or solid volume having plane-parallel interfaces can be introduced into the beam path of the projection objective, the optical thickness of the at least one volume being at least substantially equal to the optical thickness of the immersion space.

The invention is based on the idea that the immersion liquid introduced into the immersion space is comparable to a plane-parallel plate in terms of its optical effect. The relocation of a plane-parallel plate does not affect the focal length when such a relocation takes place only over optical elements without any refractive power. The correction of a wide variety of imaging errors is likewise not compromised by such a relocation of a plane-parallel plate. If, instead of the immersion liquid, a volume which has the same optical thickness as the volume previously filled with immersion liquid in the immersion space, that is to say the same product of refractive index and geometrical thickness, is introduced into the beam path of the projection objective, this is therefore equivalent to merely relocating a plane-parallel plate along the optical axis. If the immersion liquid is removed and the said volume is introduced into the beam path to replace it when changing from immersed operation to dry operation, this therefore does not affect the focal length of the projection objective. Similar considerations apply to the converse case, that is to say when changing from dry operation to immersed operation. Here, the volume is removed from the beam path and immersion liquid is introduced into the immersion state space instead.

Since a plane-parallel plate can be divided into a plurality of thinner individual plates without changing the optical effect, it is also possible to introduce a plurality of volumes into the beam path instead of just one volume with the aforementioned properties when the immersion liquid is removed. The total optical thickness of all the volumes which are introduced in the direction of the optical axis should then be substantially equal to the dimension of the immersion space in this direction.

It is preferable for the refractive index of the at least one volume to be substantially equal to the refractive index of the immersion liquid, and for the sum of the dimensions of all the volumes which can be introduced in the direction of the optical axis to be at least equal to the dimension of the immersion space in this direction. Preferably, the sum of the dimensions of all the volumes which are introduced in the direction of the optical axis differs by at most 10 nm, preferably at most 1 nm, more preferably at most 0.1 nm, from the dimension of the immersion space in this direction.

As mentioned above, a relocation of a plane-parallel plate has no optical effect if the relocation takes place only over optical elements without any refractive power. Therefore, only refractive surfaces which are plane and extend parallel to the image plane should be arranged in the beam path between the image plane and the volume furthest away from the image plane. The last optical element on the image side is therefore preferably a plane-parallel terminating plate. Some refractive surfaces between the intermediate space and the image plane could nevertheless be reprocessed in order to achieve a corrective effect, so that this condition is then no longer fulfilled, or at least no longer exactly fulfilled.

It is particularly straightforward to introduce or remove the said volume into and from the beam path when the volume is liquid and the projection objective has a sealable intermediate space, for holding at least one liquid volume, between two optical elements whose mutually facing interfaces are planeparallel. An intermediate space can be filled very completely with liquids in a straightforward way. Furthermore, fewer refractive surfaces overall need to be processed with high accuracy than in the case of an additional plane-parallel plate, which is intended to replace the immersion liquid in terms of its effect on the focal length.

In the simplest case, such an intermediate space which can be filled with liquid is bounded on the image side by the terminating plate. The intermediate space which can be filled with liquid therefore lies on the rear side of the terminating plate; in order to bound the intermediate space on the object side, it is then necessary to have another refractively acting optical element whose surface on the image side is plane.

Since the optical properties of the liquids with which the immersion space and the intermediate space are alternately filled must be exactly equal, an identical liquid should be used for filling the immersion space and the intermediate space. It is even feasible to use the same liquid. This would mean that the liquid introduced into the immersion space was previously in the intermediate space, and vice versa, so that a relocation of the liquid is in fact involved. Since the liquid comes in contact with the photosensitive layer during immersed operation, the liquid may become contaminated during immersed operation. The liquid should therefore be purified before it is returned to the intermediate space.

In principle, the intermediate space as well as the immersion space may be filled and emptied by hand, for example with the aid of a pipette. Preferably, however, an immersion device by which the intermediate space and/or the immersion space can be filled with liquid and emptied is provided for this purpose. Since the liquid introduced in each case should have a maximally uniform temperature, such an immersion device may also comprise a liquid circuit in which the liquid is continuously circulated. In this way, the liquid can be progressively purified and brought to the intended temperature.

Instead of an intermediate space being filled with a liquid, the said volume may also be formed by a plane-parallel plate which has the same refractive index as the immersion liquid, with which the immersion space can be filled.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
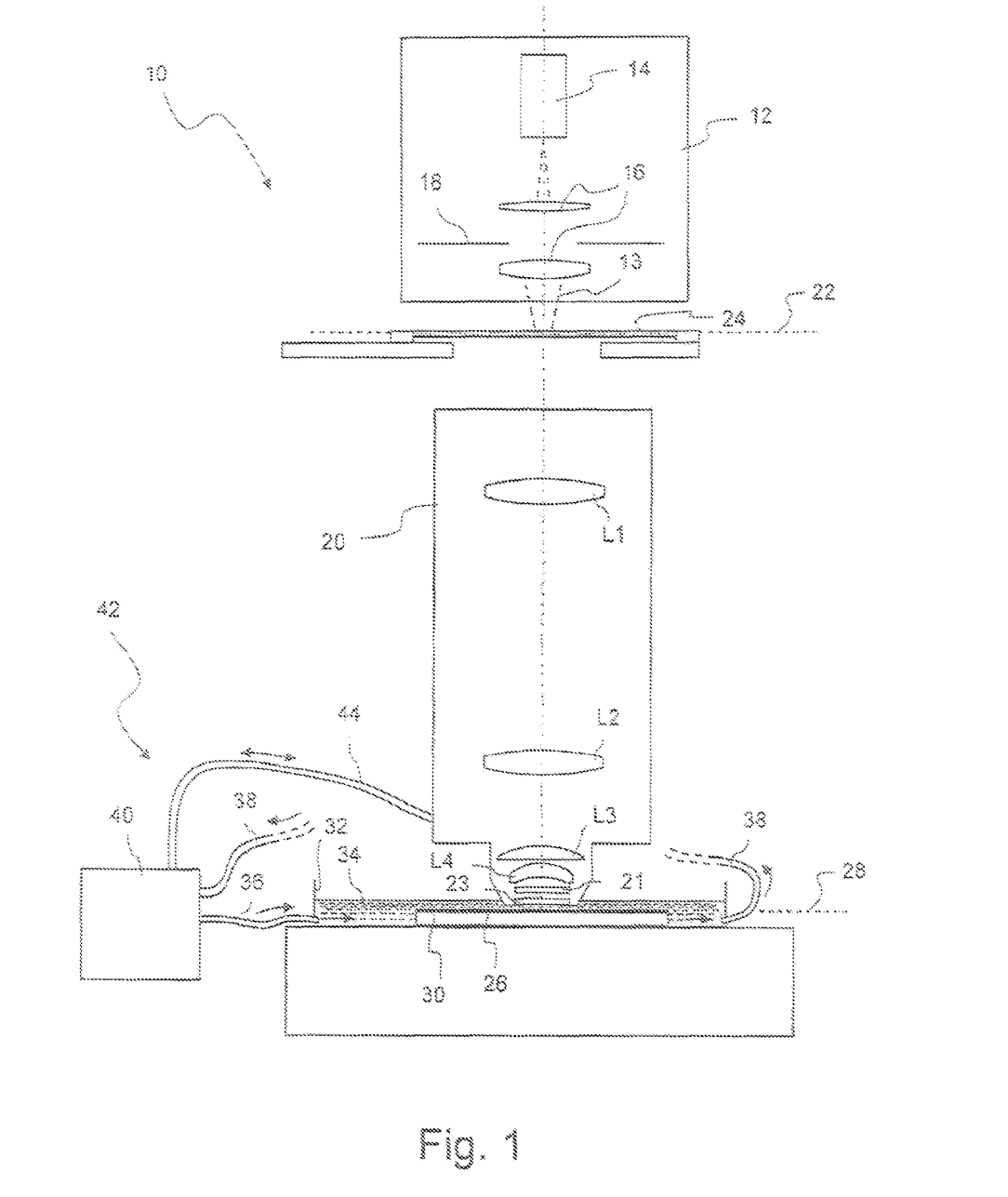
FIG. 1 shows a meridian section through a microlithographic projection exposure apparatus according to a first exemplary embodiment of the invention, in a schematic representation which is not true to scale.

FIG. 1 shows a meridian section through a microlithographic projection exposure apparatus, denoted overall by 10, during immersed operation in a highly simplified representation which is not true to scale. The projection exposure apparatus 10 has an illumination device 12 for the generation of projection light 13, which comprises a light source 14, illumination optics indicated by 16 and a diaphragm 18. In the exemplary embodiment which is represented, the projection light 13 has a wavelength of 193 nm.

The projection exposure apparatus 10 furthermore includes a projection objective 20 which contains a multiplicity of lenses, only some of which denoted by L1 to L4 are represented by way of example in FIG. 1 for the sake of clarity. The projection objective 20 furthermore contains a plane-parallel plate 21 as the last optical element, as well as a likewise plane-parallel terminating plate 23 which terminates the projection objective 20 on the image side. The lenses L1 to L4, the plate 21 and the terminating plate 23 consist of quartz glass. Nevertheless, other materials which have sufficient optical transparency at the wavelength of the projection light 13 may also be selected as the material.

The projection objective 20 is used to project a reduced image of a mask 24, which is arranged in an object plane 22 of the projection objective 20, onto a photosensitive layer 26. The layer 26, which for may example consist of a photoresist, is arranged in an image plane 28 of the projection objective 20 and is applied to a support 30.

The support 30 is fastened on the bottom of an open-topped container 32 in the form of a trough, which can be displaced (in a way which is not represented in detail) parallel to the image plane 28 with the aid of a displacement device. The container 32 is filled sufficiently with an immersion liquid 34 so that the projection objective 20 is immersed with its terminating plate 23 in the immersion liquid 34 during operation of the projection exposure apparatus 10. The immersion liquid 34 may, for example, be highly pure deionised water or a halogen-free oil. The immersion liquid 34 chosen in the represented exemplary embodiment is nitrobenzene, whose refractive index at the wavelength of the projection light 13 being used is approximately equal to the refractive index of quartz glass, of which the plate 21 and the terminating plate 23 are made.

Via a feed line 36 and a discharge line 38, the container 32 is connected to a treatment unit 40 which contains, inter alia, a circulating pump and a filter for purifying the immersion liquid 34. The treatment unit 40, the feed line 36, the discharge line 38 and the container 32 together form an immersion device denoted by 42, in which the immersion liquid 34 circulates while being purified and kept at an at least approximately constant temperature.

The immersion device 42 furthermore includes another line 44, which leads directly to the projection objective 20. Via the line 44, when changing from immersed operation to dry operation and vice versa, immersion liquid 34 can be pumped into or removed from an intermediate space which is located between the terminating element 23 and the plane-parallel plate 21.

This will be explained in more detail below with reference to FIGS. 2a and 2b, which show the end on the image side of the projection objective 20 in an enlarged representation during dry operation and immersed operation, respectively. It can be seen in FIG. 2a that an intermediate space 46, which remains between the plane-parallel plate 21 and the terminating plate 23, is sealed tightly all around. An annular sealing element 48, which is clamped between two element frames indicated by 50, 52, is used for this purpose. The element frames 50, 52 make it possible to align the plane-parallel plate 21 and the terminating plate 23, as is known per se in the prior art. The line 44 extends through the sealing element 48 into the intermediate space 46.

The plane-parallel plate 21 and the terminating plate 23 are aligned so that their mutually facing plane interfaces 56, 58 are aligned exactly parallel with a distance $d_1$ between them. When the intermediate space 46 is filled with immersion liquid 34 during dry operation, as represented in FIG. 2a, the intermediate space acts like a plane-parallel plate made of a material whose refractive index is equal to that of the immersion liquid 34.

Figure 2A:
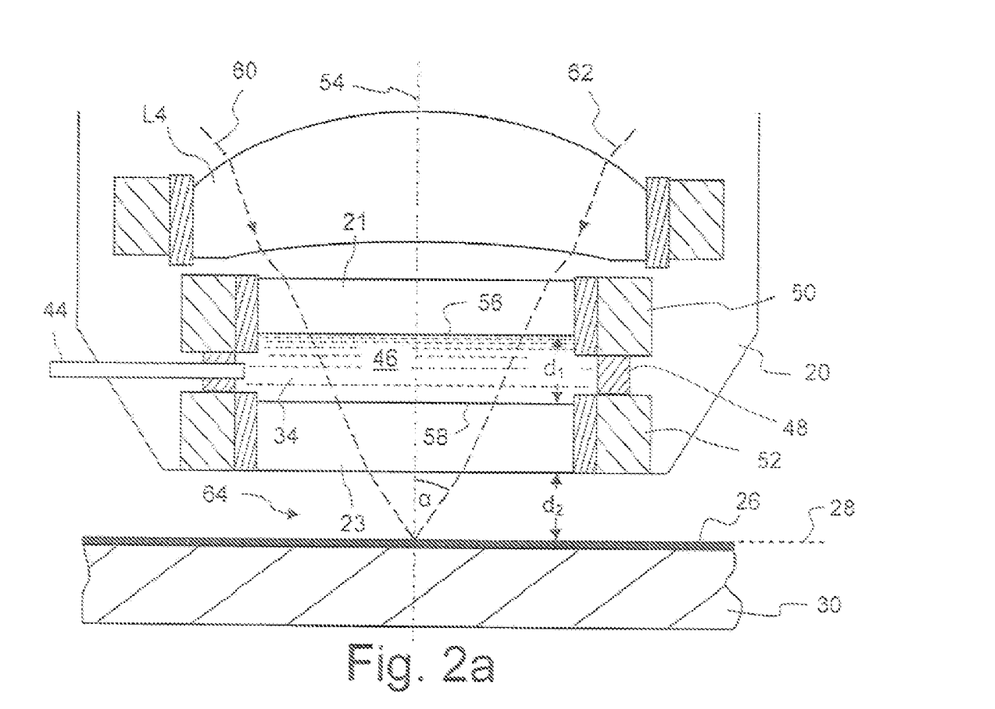
FIG. 2a shows an enlarged detail of the end on the image side of the projection objective as shown in FIG. 1, during dry operation.

Peripheral rays of the projection light 13, which pass through the projection objective 20 onto the photosensitive layer 26, are indicated by 60 and 62 in FIG. 2a. Since the refractive index of the immersion liquid 34 is substantially equal to the refractive indices of the plane-parallel plate 21 and of the terminating plate 23, the projection light 13 is almost not refracted at all when it passes through the intermediate space 46 filled with immersion liquid 34. The maximum aperture angle at which the peripheral rays 60, 62 meet at points on the photosensitive layer 26 is denoted by α in FIG. 2.

Figure 2B:
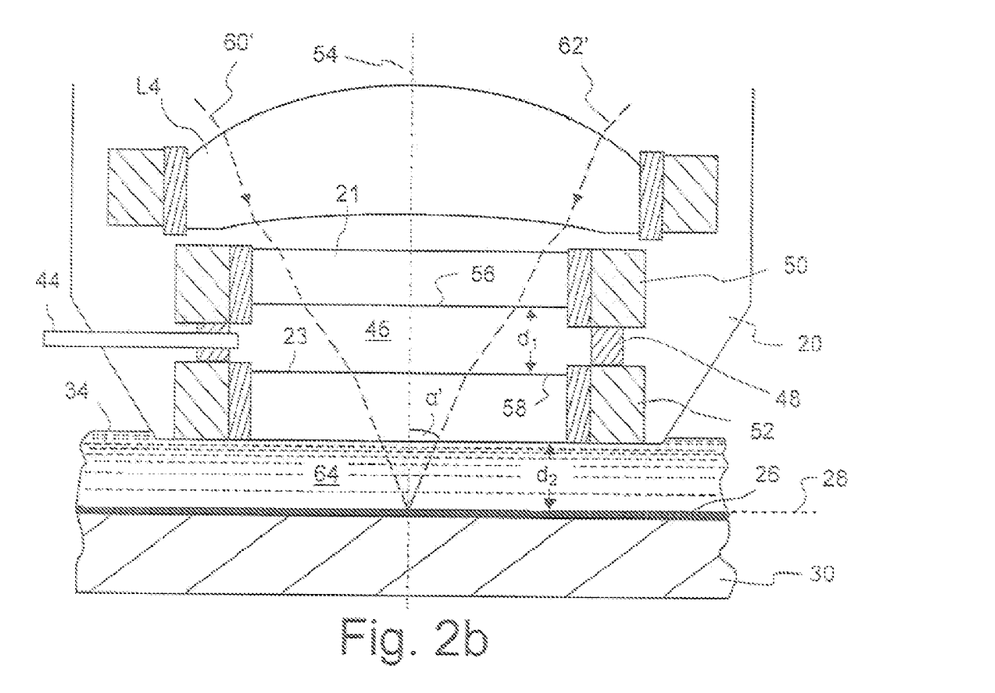
FIG. 2b shows the end on the image side in FIG. 2a, but during immersed operation.

If a change is then to be made to the immersed operation as shown in FIGS. 1 and 2b, the immersion liquid 34 will be pumped out of the intermediate space 46 via the line 44. After having been purified in the immersion device 42, the immersion liquid 34 is then introduced via the feed line 36 into the container 32 where it enters an immersion space 64, which is formed between the terminating plate 23 and the photosensitive layer 26. The projection objective 20 is in this case designed so that the height $d_1$ of the intermediate space 46 is equal to the height $d_2$ of the immersion space 64. The change from dry operation to immersed operation can therefore be readily understood as entailing relocation of a plane-parallel "plate" of immersion liquid 34 from the intermediate space 46 into the immersion space 64. Since this "plate" does not thereby change its thickness and since the optical element lying in between, namely the terminating plate 23, has plane-parallel interfaces, even after the change to immersed operation the peripheral rays denoted by 60' and 62' in FIG. 2b still meet at a point in the image plane 28 where the photosensitive layer 26 is arranged.

As can be seen in FIG. 2b, the maximum aperture angle denoted by α' has become smaller because of the change from dry operation to immersed operation. This is associated with an increase in the depth of focus since, when the photosensitive layer 26 is moved out of the image plane 28, the broadening of the focal point into a focal spot is less than the case of the dry operation as represented in FIG. 2a.

A second exemplary embodiment of a projection objective will be explained below with reference to FIGS. 3a and 3b, which are representations corresponding to FIGS. 2a and 2b. Parts which are the same are denoted by identical reference numerals, and parts which correspond to one another are denoted by reference numerals increased by 100. Wherever reference numerals increased by 100 are not explicitly mentioned in the text, then the comments made above about FIGS. 2a and 2b apply accordingly.

The projection objective 120 differs from the projection objective 20 as shown in FIGS. 2a and 2b essentially in that the projection objective 120 does not have a plane-parallel plate 21. Instead, the last optical element with non-zero refractive power in the projection objective 120 as shown in FIGS. 3a and 3b is a planoconvex lens L104. Together with an opposing plane surface 158 of a terminating plate 123, its plane surface 156 on the image side forms an intermediate space 146 of height $d_1$, which can be filled with immersion liquid 34. In terms of function, the projection objective 120 does not substantially differ from the projection objective 20 as shown in FIGS. 2a and 2b. In particular, the intended reduction of the aperture angle α and therefore the increase of the depth of focus also take place here when changing to immersed operation.

A third exemplary embodiment of a projection objective will be explained below with reference to FIGS. 4a and 4b, which are representations corresponding to FIGS. 2a and 2b. Parts which are the same are denoted by identical reference numerals, and parts which correspond to one another are denoted by reference numerals increased by 200. Wherever reference numerals increased by 200 are not explicitly mentioned in the text, then the comments made above about FIGS. 2a and 2b apply accordingly.

Figure 3A:
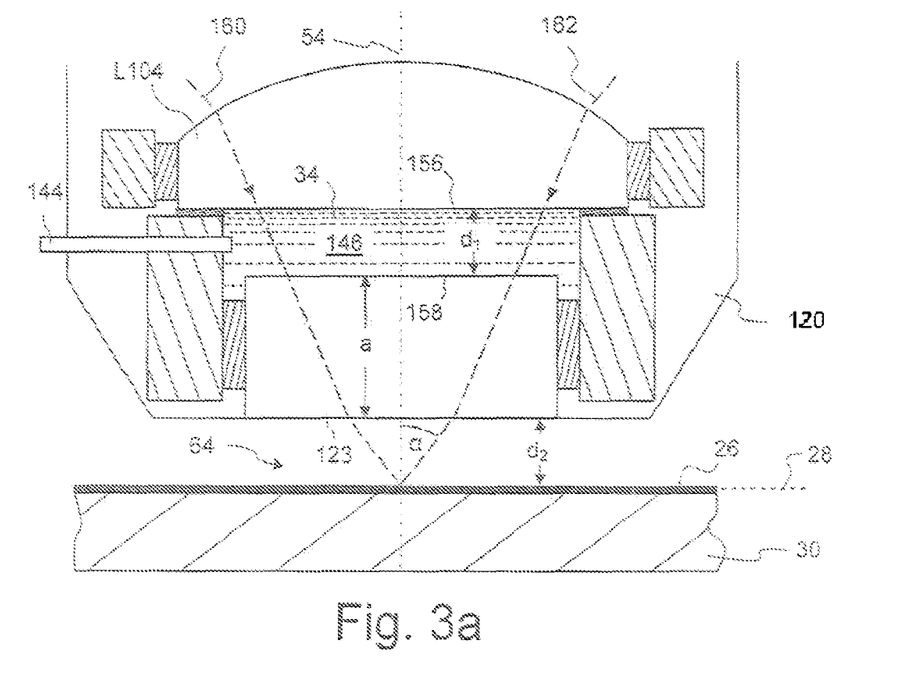
FIG. 3a shows a detail corresponding to FIG. 2a, of a projection objective according to a second exemplary embodiment of the invention during dry operation.
Figure 3B:
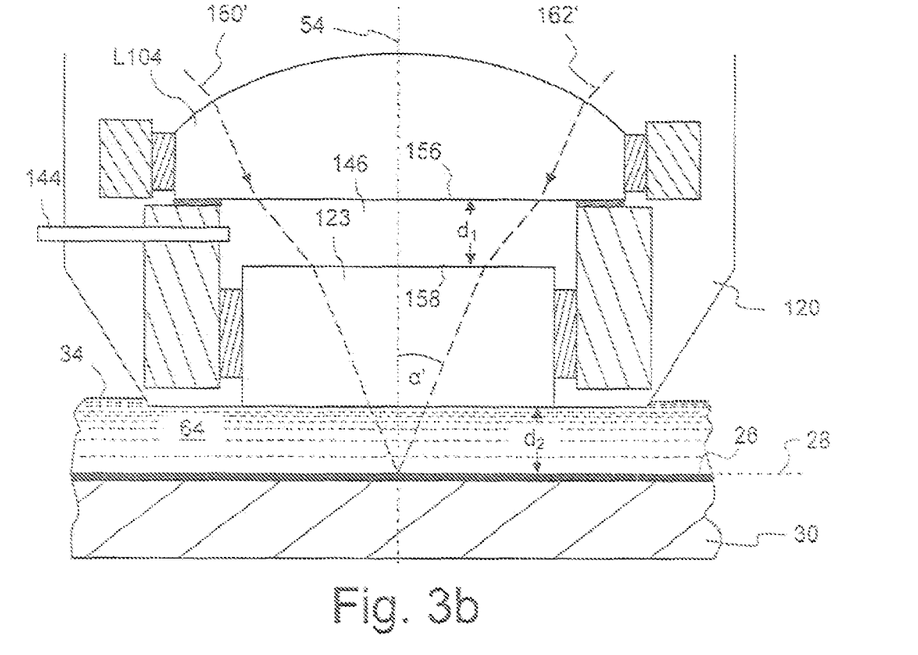
FIG. 3b shows the end on the image side in FIG. 3a, but during immersed operation.
Figure 4A:
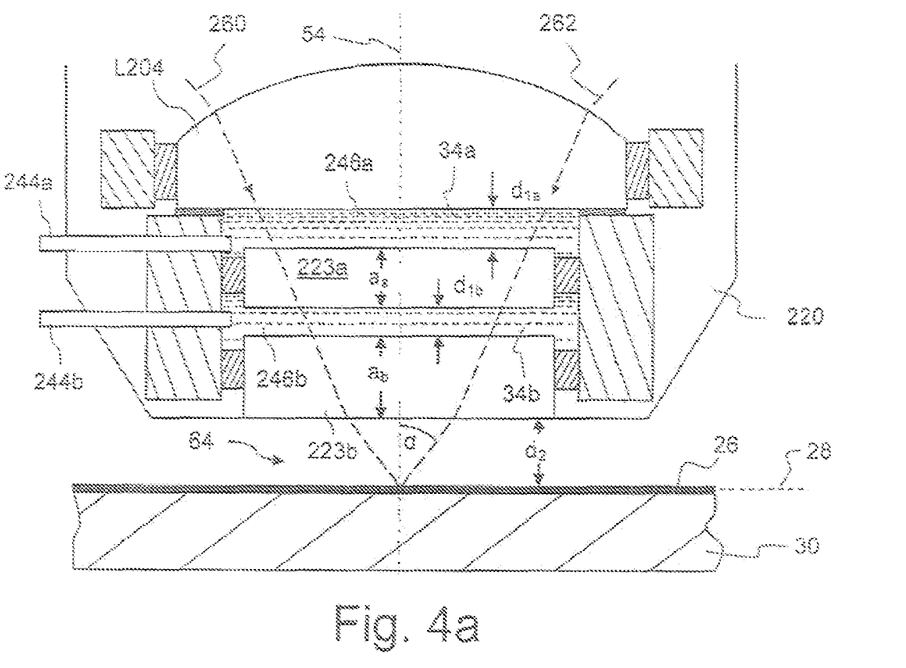
FIG. 4a shows a detail corresponding to FIG. 2a, of a projection objective according to a third exemplary embodiment of the invention during dry operation.
Figure 4B:
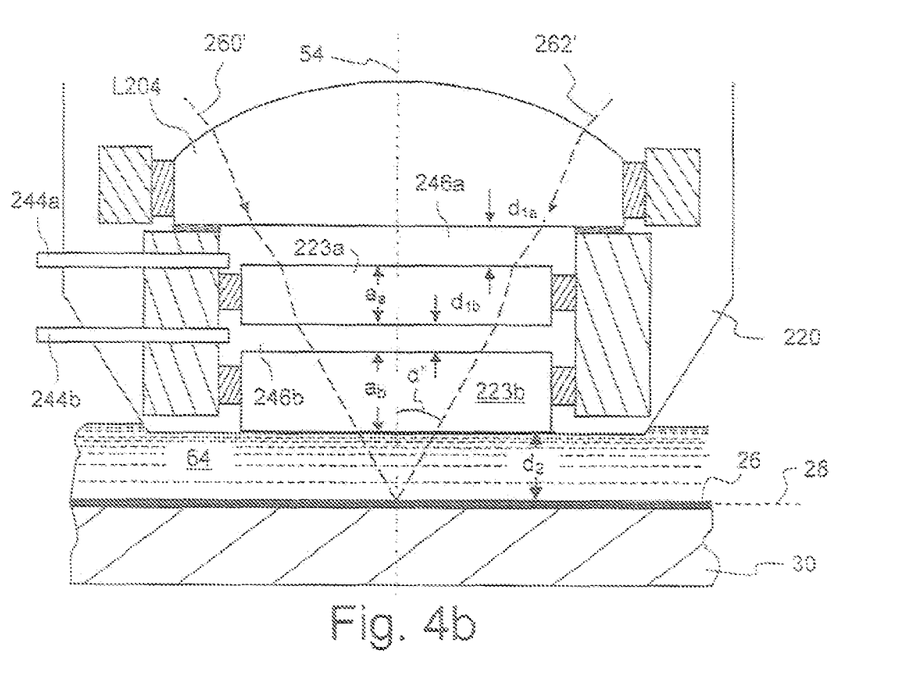
FIG. 4b shows the end on the image side in FIG. 4a, but during immersed operation.

The projection objective 220 as shown in FIGS. 4a and 4b differs from the projection objective 120 as shown in FIGS. 3a and 3b essentially in that the terminating plate 123 is divided into two individual plane-parallel plates 223a and 223b. The respective thicknesses $a_a$ and $a_b$ of the plates 223a and 223b now add up to the thickness a of the terminating plate 123 as shown in FIGS. 3a and 3b.

The division of the terminating plate 123 into two individual plane-parallel plates 223a and 223b also partitions the immersion space 146 above the terminating plate 123 into two intermediate spaces 246a and 246b, the respective heights $d_{1a}$ and $d_{1b}$ of which add up to equal the height $d_1$ of the intermediate space 146 and therefore to equal the distance $d_2$ between the terminating plate 223b on the image side and the image plane 28. On account of the separate intermediate spaces 246a and 246b, there are also two separate lines 244a, 244b by which the intermediate spaces 246a, 246b can be filled with immersion liquid 34, or this can be pumped out of them. When changing from dry operation to immersed operation, as indicated between FIGS. 4a and 4b, the maximum aperture angle α is here again reduced so that the depth of focus of the projection is improved.

A fourth exemplary embodiment of a projection objective will be explained below with reference to FIGS. 5a and 5b, which are representations corresponding to FIGS. 2a and 2b. Parts which are the same are denoted by identical reference numerals, and parts which correspond to one another are denoted by reference numerals increased by 300. Wherever reference numerals increased by 300 are not explicitly mentioned in the text, then the comments made above about FIGS. 2a and 2b apply accordingly.

Figure 5A:
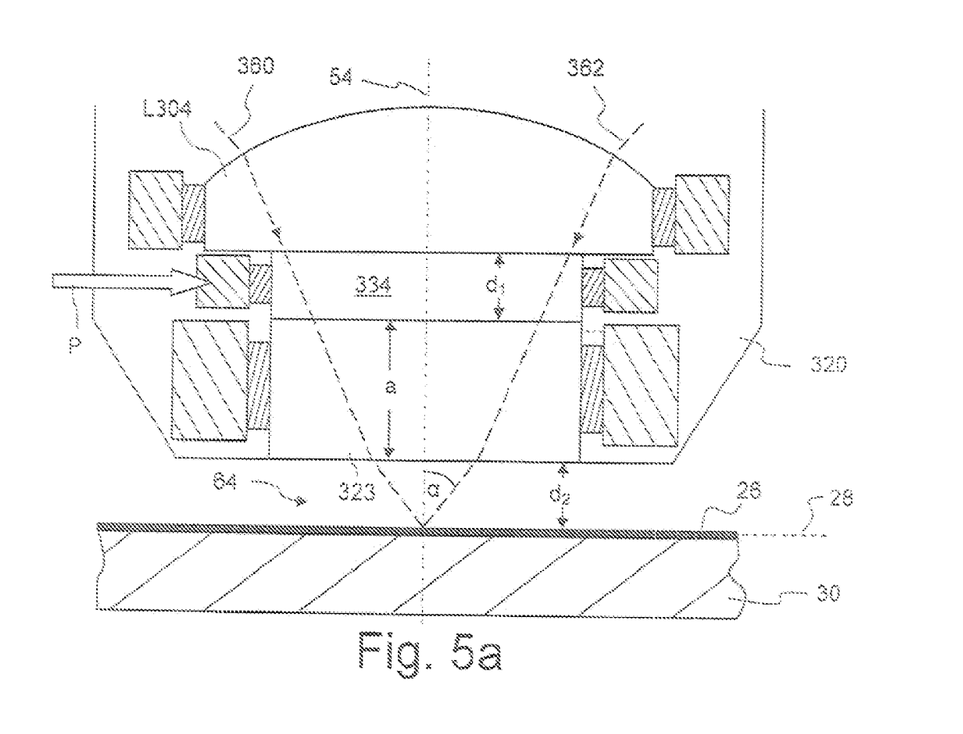
FIG. 5a shows a detail corresponding to FIG. 2a, of a projection objective according to a fourth exemplary embodiment of the invention during dry operation.
Figure 5B:
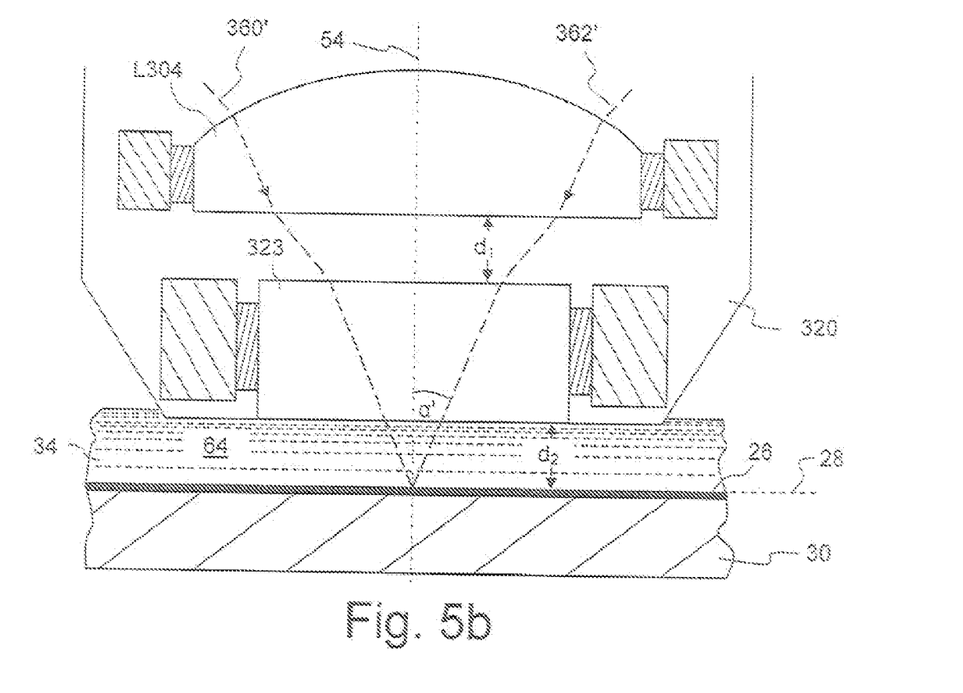
FIG. 5b shows the end on the image side in FIG. 5a, but during immersed operation.

The projection objective 320 as shown in FIGS. 5a and 5b differs from the projection objective 120 as shown in FIGS. 3a and 3b essentially in that the intermediate space 146 between the terminating plate 123 and the planoconvex lens L104 arranged above it cannot be filled with a liquid. Instead, the projection objective 320 is designed so that a plane-parallel plate 334 which also consists of quartz glass, and which therefore has approximately the same refractive index as the immersion liquid 34, can be introduced into the intermediate space 346 (see arrow P). The thickness $d_1$ of the plate 334 is in this case the same as the height $d_2$ of the immersion space 64. The plate 334 is removed from the beam path when changing to immersed operation.

A fifth exemplary embodiment of a projection objective will be explained below with reference to FIGS. 6a and 6b, which are representations corresponding to FIGS. 2a and 2b. Parts which are the same are denoted by identical reference numerals, and parts which correspond to one another are denoted by reference numerals increased by 400. Wherever reference numerals increased by 400 are not explicitly mentioned in the text, then the comments made above about FIGS. 2a and 2b apply accordingly.

Figure 6A:
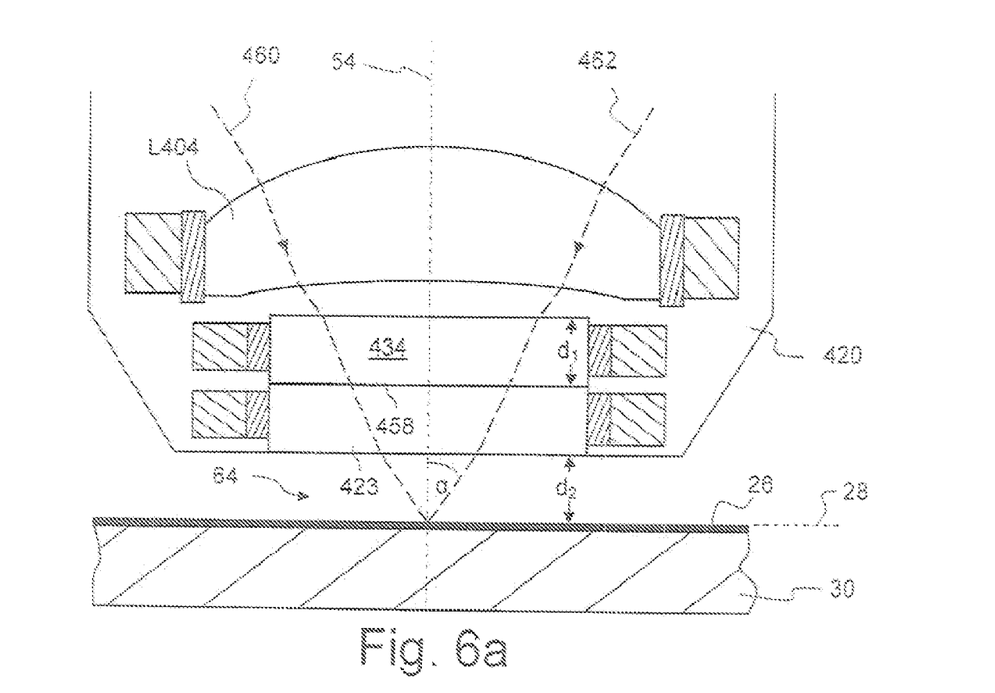
FIG. 6a shows a detail corresponding to FIG. 2a, of a projection objective according to a fifth exemplary embodiment of the invention during dry operation.
Figure 6B:
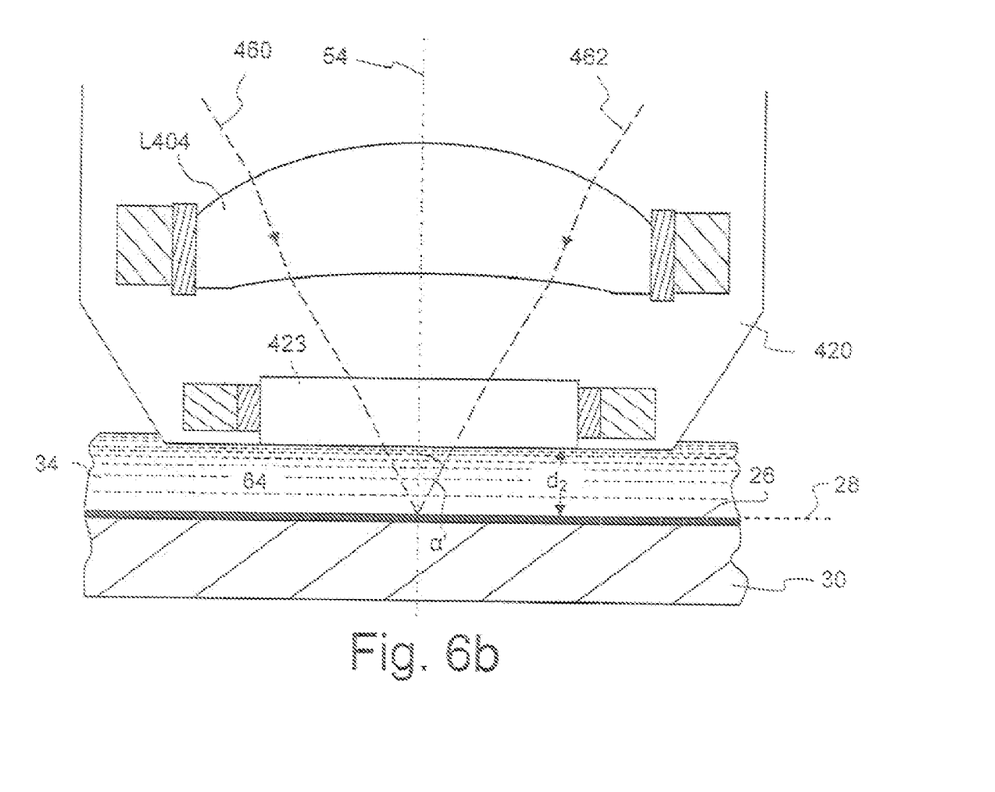
FIG. 6b shows the end on the image side in FIG. 6a, but during immersed operation.

The projection objective 420 as shown in FIGS. 6a and 6b differs from the projection objective 320 as shown in FIGS. 5a and 5b essentially in that the lens L404 is a meniscus lens instead of a planoconvex lens. During dry operation, therefore, the plane-parallel plate 334 is not inserted into an intermediate space between two plane and parallel interfaces as in the case of the projection objective 320 in FIGS. 5a and 5b, but merely rests on the plane surface 458 on the object side of the terminating plate 423 (which is thinner in this case).

The advantage of the projection objectives 320 and 420, in which respective plane-parallel plates 334 and 434 are introduced into the beam path for dry operation, is primarily that it is not necessary to provide specially dimensioned intermediate spaces as was the case for the projection objectives 20, 120 and 220. Complete reconfiguration of the projection objectives is therefore unnecessary. Instead, it is sufficient to start off with "normal" dry operation and then accommodate the additional plates 334 or 434 by modifications such as those described, for example, in US 2004/109237 A1. Such a modification can be carried out with the aid of liquid lenses whose refractive power is variable.

The invention claimed is:

1. A projection objective configured so that during use the projection objective can direct light from an object plane to an image plane, the projection objective comprising:
    a last optical element on an image side of the objective, wherein the last optical element is plane on the image side and confines, together with the image plane, an immersion space which is configured to be filled with an immersion liquid, and
    at least one liquid or solid volume, which
        has plane-parallel interfaces,
        is configured to be introduced into a beam path of the projection objective and
        has an optical thickness that is substantially equal to the optical thickness of the immersion space when the immersion space is filled with the immersion liquid,
    wherein the projection objective is configured to be used in a microlithographic projection exposure apparatus.

2. The objective of claim 1, wherein only refractive surfaces being plane and extending parallel to the image plane are arranged in a beam path between the image plane and the at least one liquid or solid volume which is furthest away from the image plane.

3. The objective of claim 2, wherein the last optical element on the image side is a plane-parallel terminating plate.

4. The objective of claim 1, wherein the at least one liquid or solid volume has a refractive index which is substantially equal to the refractive index of the immersion liquid, and wherein the overall extension of the at least one liquid or solid volume along an optical axis of the objective is substantially equal to the dimension of the immersion space along the optical axis.

5. The objective of claim 4, wherein the overall extension of the at least one liquid or solid volume along the optical axis differs by less than 10 nm from the dimension of the immersion space along the optical axis.

6. The objective of claim 5, wherein the overall extension of the at least one liquid or solid volume along the optical axis differs by less than 1 nm from the dimension of the immersion space along the optical axis.

7. The objective of claim 6, wherein the overall extension of the at least one liquid or solid volume along the optical axis differs by less than 0.1 nm from the dimension of the immersion space along the optical axis.

8. The objective of claim 1, wherein the at least one liquid or solid volume is a liquid, and wherein the objective comprises a sealable intermediate space arranged between two optical elements having mutually facing plane-parallel interfaces, said intermediate space being configured to receive the liquid.

9. The objective of claim 8, wherein the last optical element on the image side is a plane-parallel terminating plate which forms one of the two optical elements.

10. The objective of claim 9, further comprising an immersion device which is configured to fill and empty the immersion space and to fill and empty the intermediate space with the same liquid.

11. The objective of claim 1, wherein the at least one liquid or solid volume is formed by a plane-parallel plate which has the same refractive index as the immersion liquid.

12. A microlithographic projection exposure apparatus comprising the objective of claim 1.

13. A method for converting a projection objective of a microlithographic projection exposure apparatus from dry operation to immersed operation, the method comprising:
   a) providing a projection objective comprising a last optical element on an image side of the objective, wherein the last optical element is plane on the image side and confines, together with the image plane, an immersion space which is configured to be filled with an immersion liquid;
   b) removing at least one liquid or solid volume from a location in the beam path of the objective that is different from the immersion space, wherein the at least one liquid or solid volume has plane-parallel interfaces, and has an optical thickness that is substantially equal to the optical thickness of the immersion space when the immersion space is filled with the immersion liquid; and
   c) filling the immersion space with an immersion liquid which has the same refractive index as the at least one volume removed in step b).

14. The method of claim 13, wherein the at least one liquid or solid volume is liquid, and wherein the liquid volume is removed in step b) and relocated into the immersion space.

15. The method of claim 13, wherein, after exposures have been carried out in immersed operation, the objective is converted back to dry operation by removing the liquid from the immersion space and re-introducing the at least one volume removed in step b) into the beam path of the objective.

16. A method for the microlithographic production of microstructured components, the method comprising:
   a) providing a support, on at least some of which a layer of a photosensitive material is applied;
   b) providing a reticle which contains structures to be projected;
   c) providing the objective of claim 1; and
   d) projecting at least a part of the reticle onto a region on the layer with the aid of the objective provided in step c).

17. The method of claim 16, wherein the method is used to provide a microstructured component.

18. A projection objective configured so that during use the projection objective can direct light from an object plane to an image plane, the projection objective compnsing:
   an optical axis,
   a space which
      is configured to be filled with a liquid and
      is confined by two at least substantially plane-parallel surfaces extending perpendicularly to the optical axis, and
   at least one liquid or solid volume, which
      has plane-parallel interfaces,
      is configured to be introduced into a beam path of the projection objective and
      has an optical thickness that is substantially equal to the optical thickness of the space when it is filled with the liquid,
   wherein the projection objective is configured to be used in a microlithographic projection exposure apparatus.

19. The objective of claim 18, wherein only refractive surfaces being plane and extending perpendicular to the optical axis are arranged between the space and the at least one liquid or solid volume which is furthest away from the space.

20. The objective of claim 18, wherein one of the surfaces confining the space coincides with the image plane, and wherein the liquid is an immersion liquid.

21. The objective of claim 20, wherein the at least one liquid or solid volume has a refractive index which is substantially equal to the refractive index of the immersion liquid, and wherein the overall extension of the at least one liquid or solid volume along the optical axis is substantially equal to the dimension of the space along the optical axis.

22. The objective of claim 21, wherein the overall extension of the at least one liquid or solid volume along the optical axis differs by less than 10 nm from the dimension of the space along the optical axis.

23. The objective of claim 22, wherein the overall extension of the at least one liquid or solid volume along the optical axis differs by less than 1 nm from the dimension of the space along the optical axis.

24. The objective of claim 23, wherein the overall extension of the at least one liquid or solid volume along the optical axis differs by less than 0.1 nm from the dimension of the space along the optical axis.

25. The objective of claim 18, wherein the at least one liquid or solid volume is a liquid, and wherein the objective comprises a sealable intermediate space arranged between two optical elements having mutually facing plane-parallel interfaces, said intermediate space being configured to receive the liquid.

26. The objective of claim 25, wherein the space is an immersion space which is contiguous to the image plane, and wherein the objective comprises a plane-parallel terminating plate which is the last optical element on the image side and which separates the intermediate space from the immersion space.

27. The objective of claim 26, further comprising an immersion device which is configured to fill and empty the immersion space and to fill and empty the intermediate space with the same liquid.

28. The objective of claim 18, wherein the at least one liquid or solid volume is formed by a plane-parallel plate which has the same refractive index as the liquid.

29. A microlithographic projection exposure apparatus comprising the objective of claim 18.

30. A method for operating a projection objective of a microlithographic projection exposure apparatus, the method comprising:
   a) providing a projection objective comprising an optical axis and an empty space which is configured to be filled with a liquid and is confined by two at least substantially plane- parallel surfaces extending perpendicularly to the optical axis;
   b) carrying out exposures;
   c) removing at least one liquid or solid volume from a location in the beam path of the objective that is different from the space, wherein the at least one liquid or solid volume has plane-parallel interfaces, and has an optical thickness that is substantially equal to the optical thickness of the space when the space is filled with the liquid; and
   d) filling the space with a liquid.

31. The method of claim 30, wherein the at least one liquid or solid volume is liquid, and wherein the liquid volume is removed in step c) and relocated into the space in step d).

32. A method for operating a projection objective of a microlithographic projection exposure apparatus, the method comprising:
- a) providing a projection objective comprising an optical axis and a space which is filled with a liquid and is confined by two at least substantially plane-parallel surfaces extending perpendicularly to the optical axis;
- b) carrying out exposures;
- c) removing the liquid from the space and
- d) introducing at least one liquid or solid volume into a location in the beam path of the objective that is different from the space, wherein the at least one liquid or solid volume has plane-parallel interfaces, and has an optical thickness that is substantially equal to the optical thickness of the space when the space is filled with the liquid.

33. The method of claim 32, wherein the at least one liquid or solid volume is liquid, and wherein the liquid is removed in step c) and introduced into the space in step d).

* * * * *

UNITED STATES PATENT AND TRADEMARK OFFICE
CERTIFICATE OF CORRECTION

| | |
|---|---|
| PATENT NO. | : 7,411,201 B2 |
| APPLICATION NO. | : 11/460706 |
| DATED | : August 12, 2008 |
| INVENTOR(S) | : Hans-Juergen Rostalski and Aurelian Dodoc |

It is certified that error appears in the above-identified patent and that said Letters Patent is hereby corrected as shown below:

Column 9, Claim 18, line 54, delete "compnising" insert --comprising--.

Signed and Sealed this

Twenty-fourth Day of February, 2009

JOHN DOLL
*Acting Director of the United States Patent and Trademark Office*